(12) United States Patent
Saripalli et al.

(10) Patent No.: US 8,638,591 B2
(45) Date of Patent: Jan. 28, 2014

(54) TFET BASED 4T MEMORY DEVICES

(75) Inventors: Vinay Saripalli, University Park, PA (US); Dheeraj Mohata, University Park, PA (US); Saurabh Mookherjea, Hillsboro, OR (US); Suman Datta, Port Matilda, PA (US); Vijaykrishnan Narayanan, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 161 days.

(21) Appl. No.: 13/153,027

(22) Filed: Jun. 3, 2011

(65) Prior Publication Data

US 2011/0299326 A1 Dec. 8, 2011

Related U.S. Application Data

(60) Provisional application No. 61/351,633, filed on Jun. 4, 2010, provisional application No. 61/351,643, filed on Jun. 4, 2010.

(51) Int. Cl.
*G11C 5/06* (2006.01)
*G11C 11/41* (2006.01)
*G11C 11/412* (2006.01)

(52) U.S. Cl.
USPC ............... 365/154; 365/188; 365/63; 365/72; 365/156

(58) Field of Classification Search
USPC .............................. 365/154, 156, 188, 63, 72
See application file for complete search history.

(56) References Cited

U.S. PATENT DOCUMENTS

| | | |
|---|---|---|
| 5,347,490 A | 9/1994 | Terada et al. |
| 6,373,107 B1 | 4/2002 | Nikaido |
| 6,603,345 B2 | 8/2003 | Takahashi |
| 6,724,650 B2 | 4/2004 | Andoh |
| 6,795,337 B2 | 9/2004 | King |
| 7,301,199 B2 | 11/2007 | Lieber et al. |
| 2002/0051379 A1 | 5/2002 | Deng et al. |
| 2004/0032761 A1 | 2/2004 | Wong |
| 2005/0200205 A1 | 9/2005 | Winn et al. |

(Continued)

FOREIGN PATENT DOCUMENTS

DE 102005048711 A1 4/2007
KR 10-2003-0033947 5/2003

OTHER PUBLICATIONS

An EPO machine translation of DE 102005048711 A1, Nirschl et al., Apr. 26, 2007.*

(Continued)

*Primary Examiner* — J. H. Hur
(74) *Attorney, Agent, or Firm* — Novak Druce Connolly Bove + Quigg LLP

(57) ABSTRACT

A four transistor (4T) memory device is provided. The device includes a first cell transistor and a second cell transistor, the first and second cell transistors coupled to each other and defining latch circuitry having at least one multi-stable node. The device further includes a first access transistor and a second access transistor, the first and second access transistors coupling the at least one multi-stable node to at least one bit-line. In the device, each of the first and second cell transistors and each of the first and second access transistors is a unidirectional field effect transistor configured for conducting current in a first direction and to be insubstantially incapable of conducting current in a second direction.

13 Claims, 17 Drawing Sheets

(56) References Cited

U.S. PATENT DOCUMENTS

| | | | |
|---|---|---|---|
| 2006/0033145 | A1 | 2/2006 | Kakoschke et al. |
| 2007/0267619 | A1 | 11/2007 | Nirschl |
| 2008/0073641 | A1 | 3/2008 | Cheng |
| 2009/0034355 | A1 | 2/2009 | Wang |
| 2009/0101975 | A1 | 4/2009 | Holz et al. |
| 2010/0034013 | A1 | 2/2010 | Krilic |
| 2010/0038713 | A1 | 2/2010 | Majhi et al. |

OTHER PUBLICATIONS

International Search Report PCT/US2011/039096 dated Jan. 19, 2012.

Nirschl et al. The Tunneling Field Effect Transistor (TFET) as an Add-on for Ultra-Low-Voltage Analog and Digital Processes; Electron Devices Meeting; IEDM Technical Digest; IEEE International; 2004 (4 pages).

Saripalli et al.; Low Power Loadless 4T SRAM cell based on Degenerately Doped Source (DDS) In0.53Ga0.47As Tunnel FETs; Presented at 15th Asia Pacific Design Automation Conference, Jan. 2010); Submission Deadline Mar. 1, 2010 (2 pages).

Pawlik; Field Induced Band-to-Band Tunneling Effect Transistor (FIBTET); 23rd Annual Microelectronic Engineering Conference, 18-21 (May 2005).

Singh; A Novel Si-Tunnel FET based SRAM Design for Ultra Low-Power 0.3V VDD Applications; Presented at 15th Asia Pacific Design Automation Conference, Jan. 2010, Submission Deadline Aug. 3, 2009 (6 pages).

Noda et al.; A Loadless CMOS Four-Transistor SRAM Cell in a 0.18-um Logic Technology; IEEE Transactions on Electron Devices, 48(12), Dec. 2001 (5 pages).

van der Wagt; Tunneling-Based SRAM; Nanotechnology 10, 571-595 (1999).

Nirschl et al.; English Abstract of DE102005048711 (2 pages) (2007).

* cited by examiner

| Gate Length, $L_G$ | 30 nm |
|---|---|
| Oxide thickness, $T_{OX}$ | 2.5 nm |
| Gate di-electric constant, $\xi$ | 21 ($HfO_2$) |
| Body thickness, $T_{Si}$ | 7 nm |
| Gate overlap | 2 nm |
| Source/Drain Doping, $N_{S/D}$ | $10^{20}$ cm$^{-3}$ |
| Channel Doping, $N_{Ch}$ | $10^{15}$ cm$^{-3}$ |

$$I_d = \frac{2q}{h}\left(\int_{E_v^{ch}}^{E_c^s} dE \cdot T_{WKB}(E) \cdot (f_s(E) - f_d(E))\right) \Big\} \begin{array}{l} E_v^{ch} > E_c^s \\ E_v^{ch} < E_c^s \end{array}$$

$$I_d = 0$$

$$T_{WKB} \approx \exp\left(\frac{4\lambda\sqrt{2m^* E_g^{\frac{3}{2}}}}{3q\hbar(E_v^{ch} - E_c^s + E_g)}\right)$$

$E_g$ (Band Gap) = 0.74 eV
$m^*$ (Tunneling Mass) ≈ 0.05 m0
$q$ (Charge of Electron) = 1.602 * 10$^{-19}$ C
$\lambda$ (Initial Barrier Width) = 2.5 nm

TFET BASED 4T MEMORY DEVICES

CROSS-REFERENCE TO RELATED APPLICATIONS

This application claims the benefit of U.S. Provisional Application Ser. No. 61/351,633 entitled "TFET BASED 4T SRAM CELL", filed Jun. 4, 2010, and U.S. Provisional Application Ser. No. 61/351,643 entitled "4T SRAM CELL USING NDR CHARACTERISTICS OF TFET", filed Jun. 4, 2010, both of which are herein incorporated by reference in their entirety.

FIELD OF THE INVENTION

The present invention relates memory devices and more particularly to TFET-based 4T memory devices.

BACKGROUND

Continued miniaturization of silicon CMOS transistor technology has resulted in an unprecedented increase in single-core and multi-core performance of modern-day microprocessors. However, the exponentially rising transistor count has also increased the overall power consumption making performance per Watt of energy consumption, the key figure-of-merit for today's high-performance microprocessors. Today, energy efficiency serves as the central tenet of high performance microprocessor technology at the system architecture level as well as the transistor level ushering in the era of energy efficient nanoelectronics. Aggressive supply voltage scaling while maintaining transistor performance is a direct approach towards reducing the energy consumption since it reduces the dynamic power quadratically and the leakage power linearly. In MOSFETs, the OFF-state leakage current (IOFF) increases exponentially with reduction of threshold voltage. There are various leakage current mechanisms, such as band to band tunneling (BTBT) at the drain-channel junction, the gate tunneling leakage current through the ultra-thin gate dielectric and even direct tunneling from source to drain increases with continued scaling. Hence there is a fundamental limit to the scaling of the MOSFET threshold voltage and hence the supply voltage. Scaling supply voltage limits the ON current (ION) and the ION-IOFF ratio. This theoretical limit to threshold voltage scaling mainly arises from MOSFETs 60 mV/decade sub-threshold swing at room temperature and it significantly restricts low voltage operation.

Leakage power consumption in SRAMs has been a major concern in caches since the International Technology Roadmap for Semiconductors (ITRS) projected that the percentage of memory in System on Chip designs (SoCs) will increase from the current 84% to as high as 94% by the year 2014. As indicated above, low voltage operation is one of the most effective low power design techniques due to its quadratic dynamic and linear static energy savings. However, in current MOSFET-based designs, lower threshold voltages increase the sub-threshold current exponentially and ultra thin gate oxides cause a huge increase in gate current. Various methods such as multiple threshold voltages and increased gate oxide thicknesses have been explored to reduce leakage current in SRAMs. Adaptive or dynamic body biasing techniques have also been explored for this purpose.

Recently, leakage reduction using steep sub-threshold transistors has gained great attention. A steep sub-threshold transistor allows us to Operate at very low threshold voltages with ultra low leakage currents and low supply voltages (VDD). TFETs, which work on the principle of inter-band tunneling, have shown to be a promising steep sub-threshold transistor. However integration of TFETs into CMOS transistor technology is generally difficult, as the unidirectionality of TFET devices generally limits their applicability to memory devices or requires more complex memory cell architectures.

SUMMARY

The embodiments of the invention concerns memory devices and methods of operating memory devices. In a first embodiment of the invention, a memory device is provided. The device includes a first cell transistor and a second cell transistor, the first and second cell transistors coupled to each other and defining latch circuitry having at least one multi-stable node. The device further includes a first access transistor and a second access transistor, the first and second access transistors coupling the at least one multi-stable node to at least one bit-line. In the device, each of the first and second cell transistors and each of the first and second access transistors is a unidirectional field effect transistor configured for conducting current in a first direction and to be insubstantially incapable of conducting current in a second direction.

In a second embodiment of the invention, a memory device is provided. The device includes a first pull down transistor and a second pull down transistor in a cross coupled configuration, where the first pull down transistor couples a first multi-stable node and a ground node and the second pull down transistor couples a second multi-stable node and the ground node. The device further includes a first access transistor and a second access transistor, the first access transistor coupling a first bit-line to the first multi-stable node, and the second access transistor coupling a second bit-line to the second multi-stable node. In the device, the first access transistor is configured to conduct current from the first bit-line to the first multi-stable node and to be substantially incapable of conducting current from the first multi-stable node to the first bit-line. Further, the second access transistor is configured to conduct current from the second bit-line to the second multi-stable node and to be substantially incapable of conducting current from the second multi-stable node to second bit-line.

In a third embodiment of the invention, a memory device is provided. The device includes a first diode connected transistor and a second diode connected transistor arranged in series between a supply node and a ground node and defining a common multi-stable node. The device also includes a first access transistor and a second access transistor, where each of the first and second access transistors coupling a common bit-line and the common multi-stable node. In the device, each of the first and second diode connected transistors and each of the first and second access transistors comprises a unidirectional field effect transistor configured for conducting: current in a first direction and to be insubstantially incapable of conducting current in a second direction. Further each of the first and second diode connected transistors are arranged in a same current conducting orientation while each of the first and second access transistors are arranged in opposing current conducting orientations. A controller can be provided, for adjusting the negative differential resistance characteristics of the first and cell diode connected transistors.

In other embodiments, methods for operating the above-mentioned devices are also provided.

BRIEF DESCRIPTION OF THE DRAWINGS

FIG. 11 shows an exemplary band-to-band tunneling integral.

DETAILED DESCRIPTION

Figure 1A:
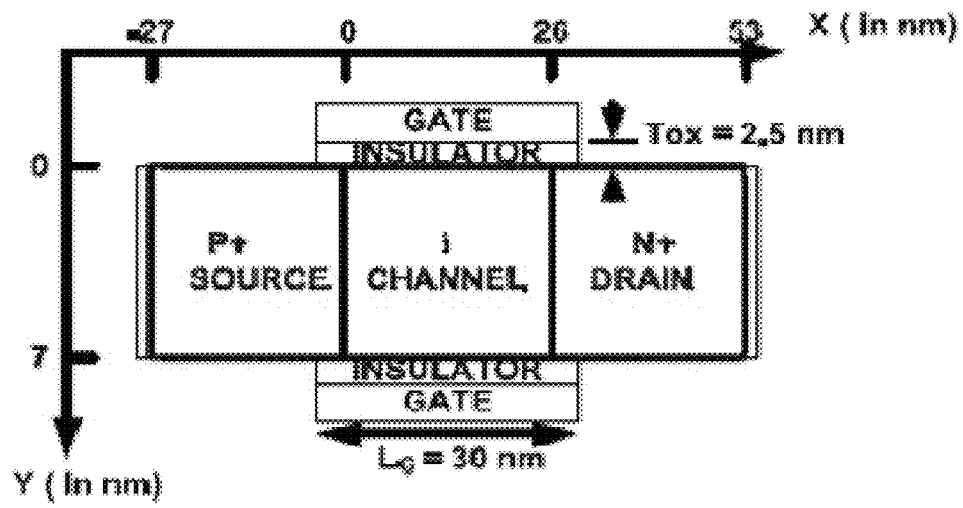
FIGS. 1A and 1B shows an optimized double gate device structure of silicon based N-channel (N-type) and P-channel (P-type) TFETs, respectively.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the various embodiments, TFET based four transistor (4T) memory devices and methods of operating such devices are provided. In particular, the 4T memory devices in accordance with the various embodiments can include a first cell transistor and a second cell transistor, where the first and second cell transistors are arranged to define latch circuitry having one or more multi-stable nodes. As used herein, the term "multi-stable" node refers to a node in the 4T memory devices that can be programmed to any of two or more stable states defined by latch circuitry of the 4T memory device. Additionally, the 4T memory devices also include a first access transistor and a second access transistor, where the first and second access transistors are used to couple the multi-stable nodes to one or more bit-lines for reading and writing information to the multi-stable nodes. In the various embodiments, at least the first and second access transistors can consist of a unidirectional field effect transistor configured for conducting current in a first direction and to be insubstantially incapable of conducting current in a second direction. Such unidirectional field transistors can be quantum field effect transistors or tunneling field effect transistors, as described in greater detail below. In some embodiments, the first and second cell transistors can also be unidirectional field effect transistors. In the various embodiments, the transistors can be arranged in various ways. For example, in some embodiments, the cell transistors can be cross-coupled to define loadless SRAM memory devices. In other embodiments, the cell transistors can be diode connected and arranged in series to define negative differential resistance (NDR) devices.

I. Tunnel Field Effect Transistors (TFETs)

Figure 1B:
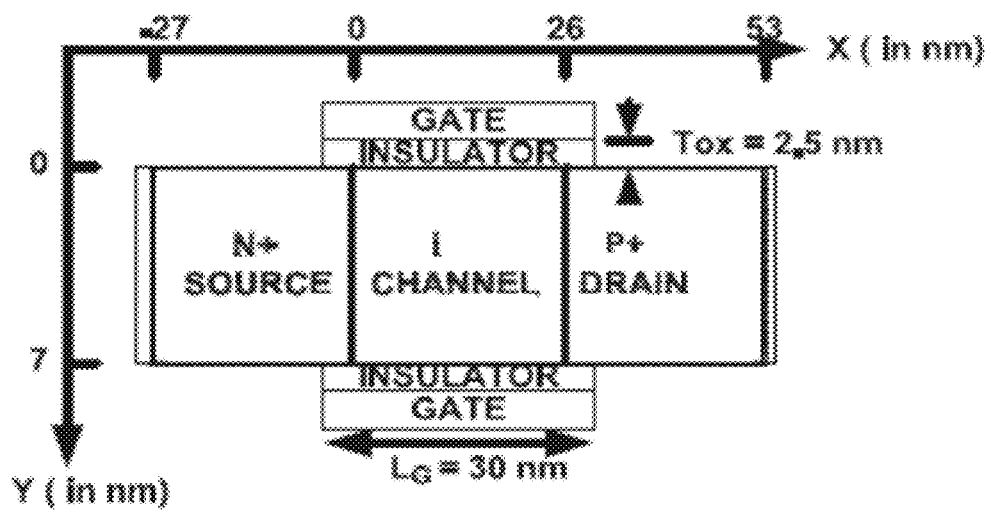

Prior to discussing the various embodiments of the invention, it may be useful to discuss the characteristics of TFET devices suitable for carrying out the various embodiments. As described above, the inter-band Tunnel Field Effect Transistor (TFET) is of great interest due to its potential for sub-KT/q sub-threshold slope device operation which enables supply voltage reduction for low power logic applications. FIGS. 1A and 1B shows an optimized double gate device structure of silicon based N-channel (N-type) and P-channel (P-type) TFETs, respectively. A conventional N-type TFET consists of a p+ source, intrinsic (i) channel and a n+ drain and a conventional P-type TFET has n+ source, intrinsic channel and drain regions. In general, the source and drain regions are heavily doped regions with the channel region being intrinsic. Further, the gate work function of an N-channel TFET is typically modified suitably to obtain a P-channel TFET.

Figures 2, 3:
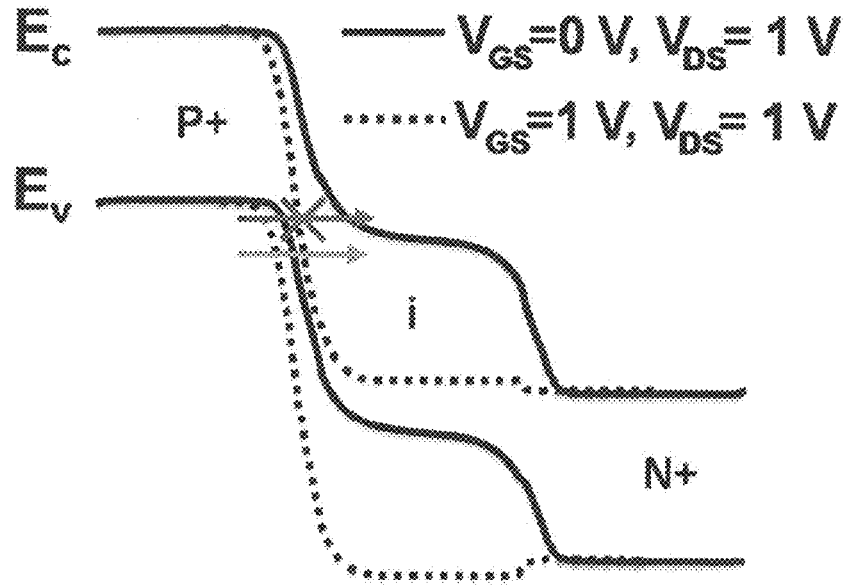
FIG. 2 shows the band-diagram of a conventional N-type silicon-based TFET during the ON and OFF state.
FIG. 3 shows a table of an exempla set of parameters for silicon-based TFET devices for use in the various embodiments.

FIG. 2 shows the band-diagram of a conventional N-type silicon-based TFET during the ON and OFF state. In the OFF state ($V_{GS}=0V$, $V_{DS}=1V$), in general, the conduction ability of the MOSFET is limited by the source side p-n junction barrier which prevents the thermionic emission of carriers. In the ON state ($V_{GS}=1V$, $V_{DS}=1V$), the source barrier is negligible which enables over the barrier thermionic emission. In contrast, TFETs operate by tunneling of carriers from the valence band in the source to the conduction band in the channel. In the OFF state ($V_{GS}$=0V, $V_{DS}$=1V), the transmission probability is typically low due to the thick depletion region associated with the source to channel tunnel junction resulting in very low OFF currents. With the application of the gate voltage ($V_{GS}$=1V, $V_{DS}$=1V), the depletion region shrinks and the carriers tunnel through the barrier % Since the TFET ON current is generally limited by the inter-band quantum mechanical tunneling (as opposed to thermionic emission over the barrier) the ON current in silicon TFETs is typically much lower than MOSFETs. The reverse biased leakage current under in the OFF state ($V_{GS}$=0V, $V_{DS}$=1V) yields extremely low OFF current in the order of pico-Amperes to femto-Amperes.

Figure 4:
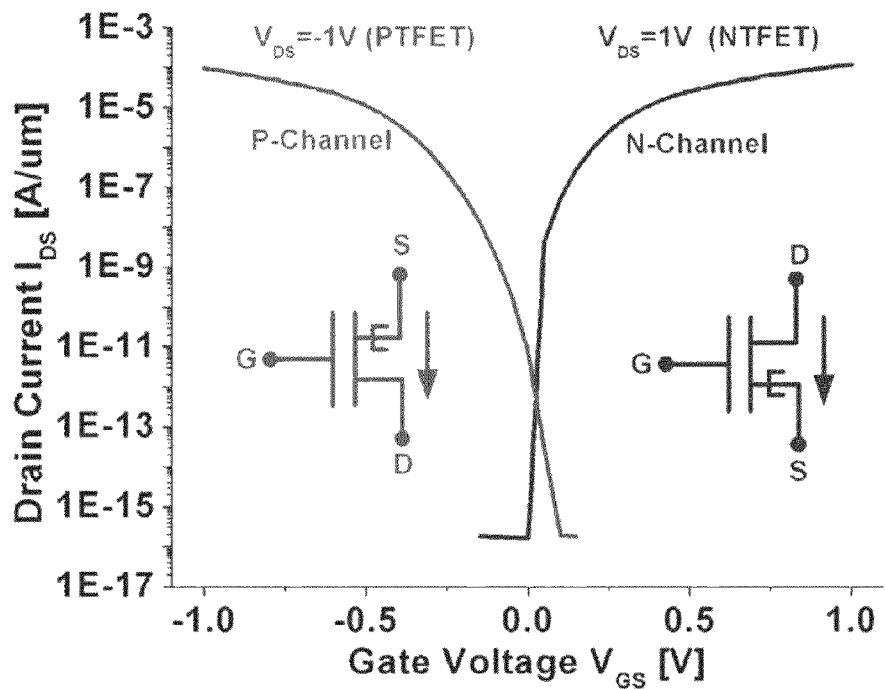
FIG. 4 shows the ID-VG characteristics of Si NTFET and PTFET devices at $V_{DS}=1V$.
Figure 5:
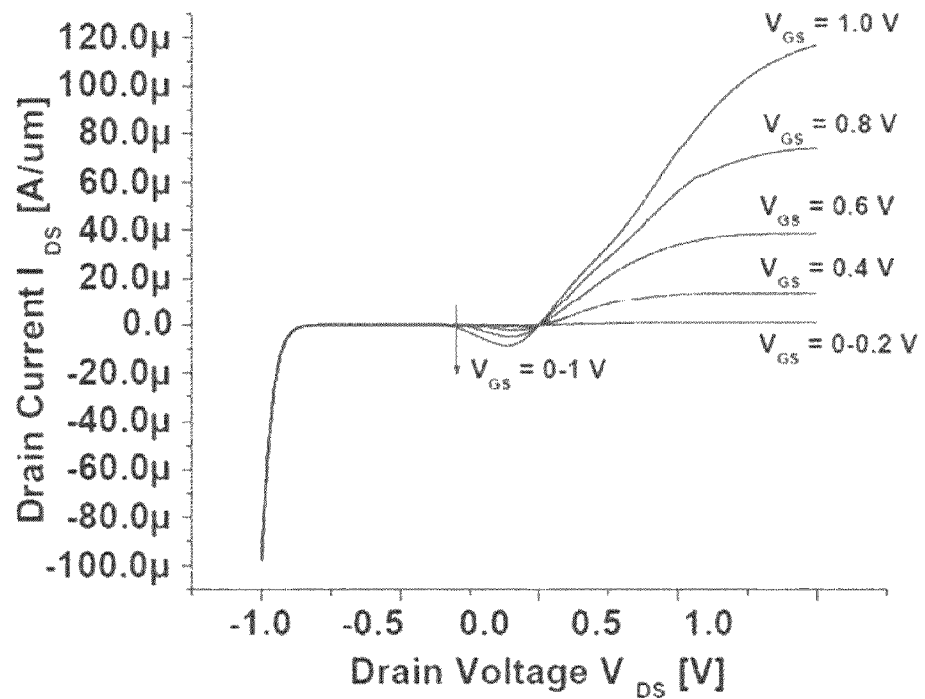
FIG. 5 shows the ID-VD characteristics of the Si NTFET for different values of $V_{GS}$.

The table in FIG. 3 shows an exemplary set of parameters for TFET devices for use in the various embodiments. FIG. 4 shows the ID-VG characteristics of such Si NTFET and PTFET devices at $V_{DS}$=1V. As shown in FIG. 4, an $I_{DSAT}$=120 µA/µm of is obtained for both the NTFET and PTFET devices. In the various embodiments, the reverse bias leakage can be set to the order of pico-femto amperes by modifying the gate work function. The gate leakage can be negligible if high-k dielectrics are used. FIG. 5 shows the ID-VD characteristics of the Si NTFET for different values of $V_{GS}$. As shown in FIG. 5 5, the NTFET device exhibits expected characteristics due to tunneling during positive $V_{DS}$ (reverse bias conditions) while $I_{DS}$ increases significantly for two conditions when $V_{DS}$ is negative (forward bias). When $V_{DS}$ is ~—1V, there is a significant $I_{DS}$ irrespective of the value of $V_{GS}$ Significant current conduction is also observed when $V_{DS}$ is slightly negative and $V_{GS}$ is positive. This is due to electrons tunneling from the conduction band of intrinsic 'i' region to the valence band of p+ source region.

Figure 6A:
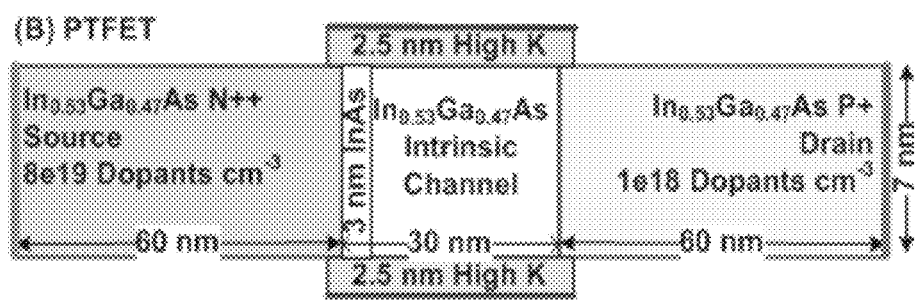
FIGS. 6A and 6B show exemplary designs for a $In_{0.53}Ga_{0.47}As$ (Degenerately-Doped-Source or DDS) PTFET and a $In_{0.53}Ga_{0.47}As$ (DDS) NTFET, respectively.
Figure 6B:
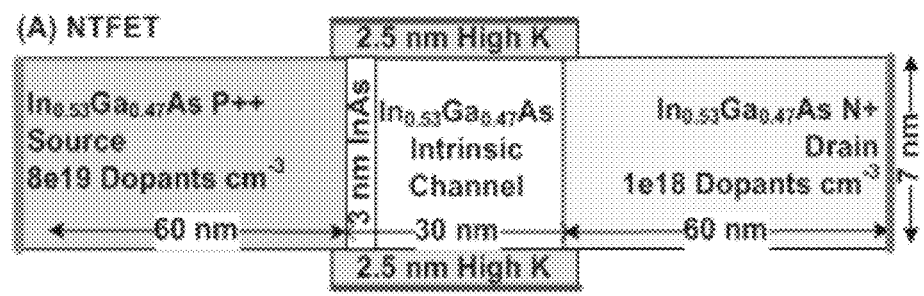

However, the various embodiments are not limited solely to the user of silicon-based TFET devices. Rather, suitable TFET devices can be provided using other types of the semiconductor materials. For example, FIGS. 6A and 6B show exemplary designs for a $In_{0.53}Ga_{0.47}As$ (DDS) PTFET and a $In_{0.53}Ga_{0.47}As$ (DDS) NTFET, respectively. These TFETS are identical, but reversed doping profiles to maximize drive current. The characteristics of such TFETS are shown in FIGS. 7, 8A, and 8B.

Figure 7:
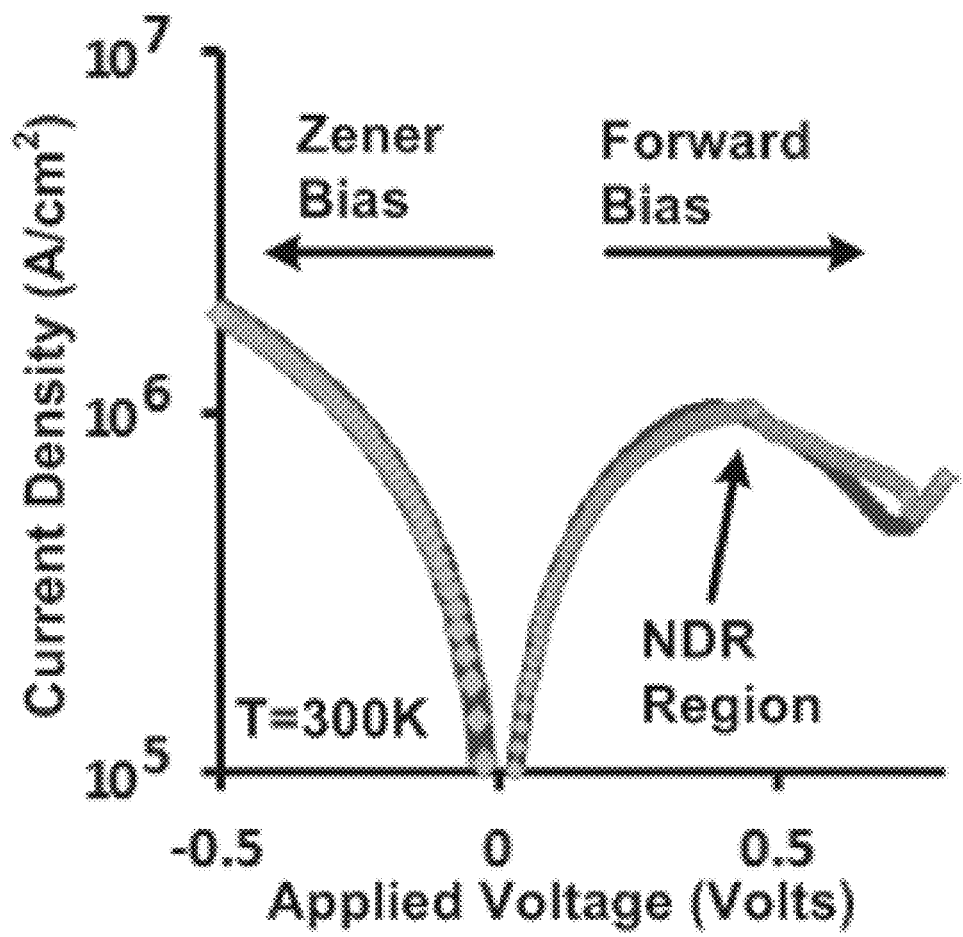
FIG. 7 shows the forward and reverse bias characteristics of the $In_{0.53}Ga_{0.47}As$ Esaki tunnel diode formed by the structures in FIGS. 6A and 6B.

FIG. 7 shows the forward and reverse bias characteristics of the $In_{0.53}Ga_{0.47}As$ Esaki tunnel diode formed by the structures in FIGS. 6A and 6B using Sentaurus TCAD. From FIG. 7, the nonlocal band-to-band tunneling model parameters ($m_C$=0.07 $m_0$, $m_V$=0.05$m_0$, $g_C$=$g_V$=0.1 and $E_G$=0.74) were extracted for generating the simulations in FIGS. 8A and 8B. It is also worth noting that in the forward bias regime, the structures in FIGS. 6A and 6B exhibit negative differential resistance characteristics. That is as the forward bias voltage is increased, the current initially increases, then decreases momentarily before beginning to increase again. In other words, the resistance across the diode initially decreases, momentarily increases, and then continues to decrease as forward bias voltage is increased.

Figure 8A:
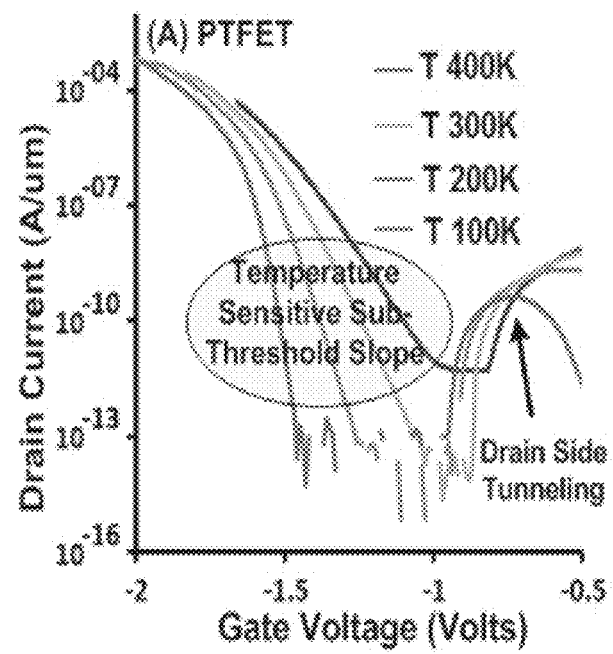
FIGS. 8A and 8B show sub-threshold slopes for the DDS PTFET in FIG. 6A and DDS NTFET in FIG. 6B at a Drain Bias of 0.5 Volts.
Figure 8B:
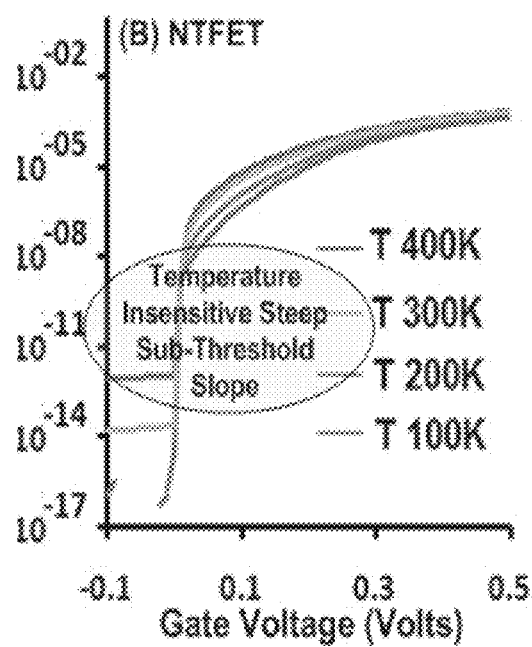

FIGS. 8A and 8B show sub-threshold slopes for the DDS PTFET in FIG. 6A and DDS NTFET in FIG. 6B at a Drain Bias of 0.5 Volts. As shown in FIG. 8A, a kT/q dependent subthreshold slope occurs for the PTFET. This is in contrast to the steep subthreshold for the NTFET, as shown in FIG. 8B.

Figure 9A:
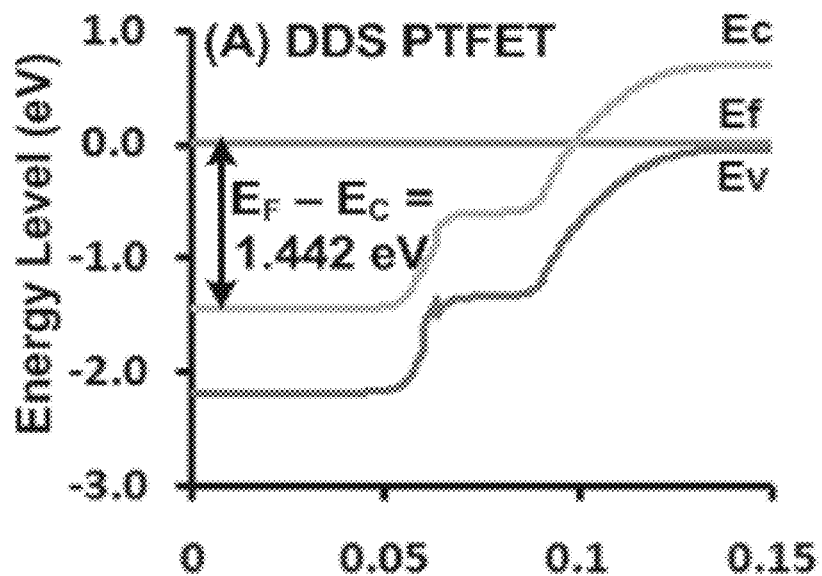
FIGS. 9A and 9B show the band diagrams for the DDS PTFET in FIG. 6A and DDS NTFET in FIG. 6B, respectively.
Figure 9B:
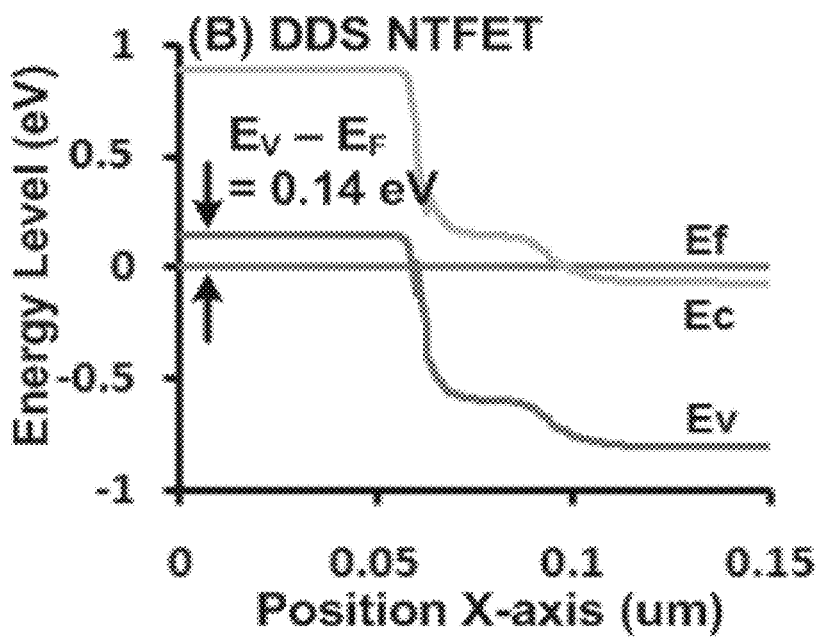
Figure 10A:
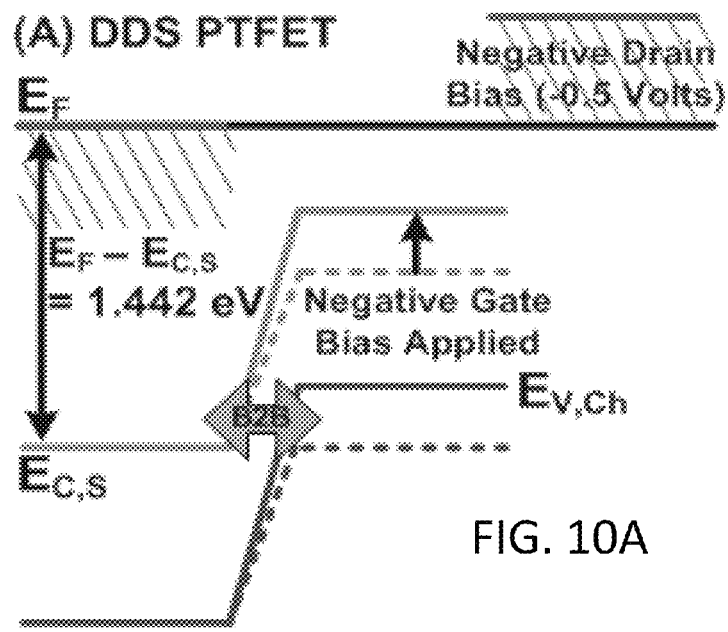
FIGS. 10A and 10B show simplified band diagrams for the DDS PTFET in FIG. 6A and DDS NTFET in FIG. 6B, respectively.
Figure 10B:
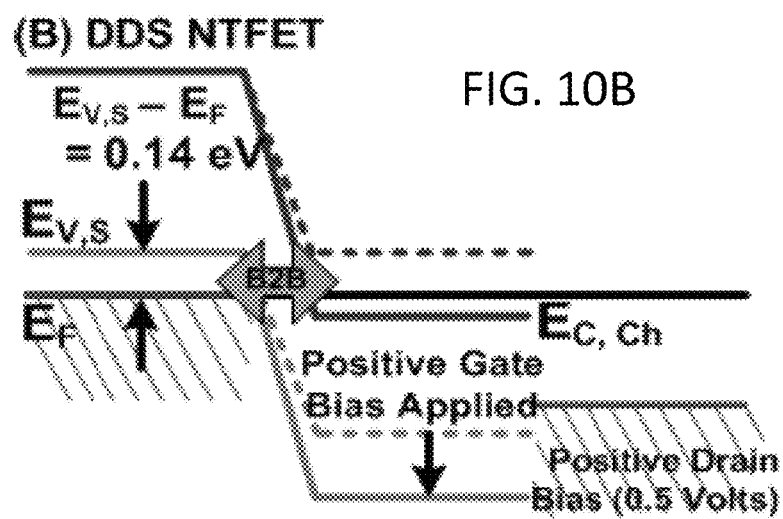

Because of the different effective density of states for the conduction band ($N_C$=2.1e17 $cm^3$) and the valence band ($N_V$=7.7e18 $cm^3$) in $In_{0.53}Ga_{0.47}As$, the Fermi level ($E_{F,S}$) in the n+ DDS region ($N_D$=8e19 $cm^3$) of the PTFET is 1.442 eV above the conduction bond edge ($E_{C,S}$), as shown in the band diagram of FIG. 9A for the PTFET of FIG. 6A (FIG. 4A). In contrast, the Fermi level ($E_{F,S}$) is only 0.1.4 eV below the valence band edge ($E_{V,S}$) in the p+ DDS region ($N_A$=8e19 $cm^3$), as shown in the bond diagram of FIG. 9B for the NTFET of FIG. 6B. However, if one considers a simplified band diagram model, as shown in FIGS. 10A and 10B for the TFETs FIGS. 6A and 6B, respectively, and evaluate the band-to-band tunneling integral shown in FIG. 11. The results in FIGS. 12A-12D are obtained.

Figure 12A:
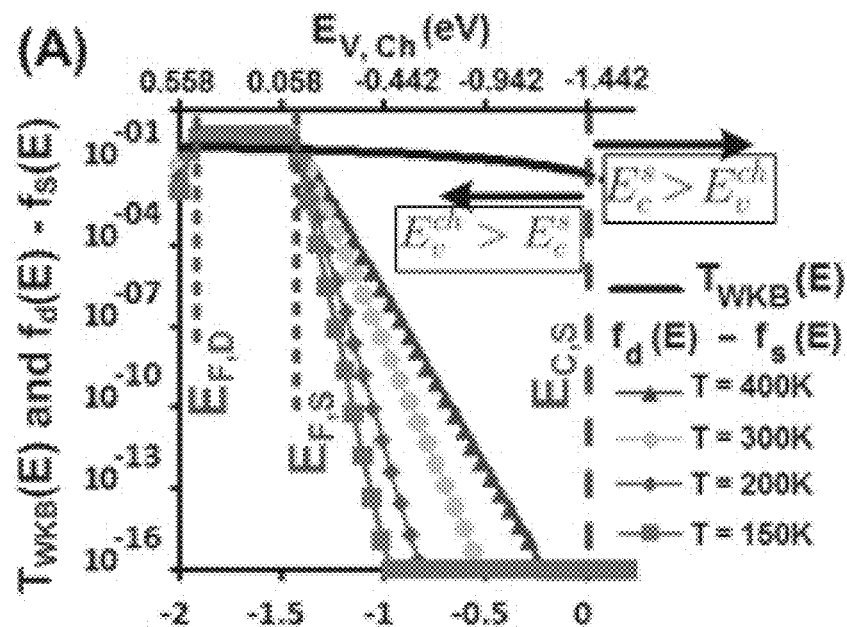
FIGS. 12A and 12B show an evaluation of the tunneling integral of FIG. 11 for the DDS PTFET in FIG. 6A.
Figure 12B:
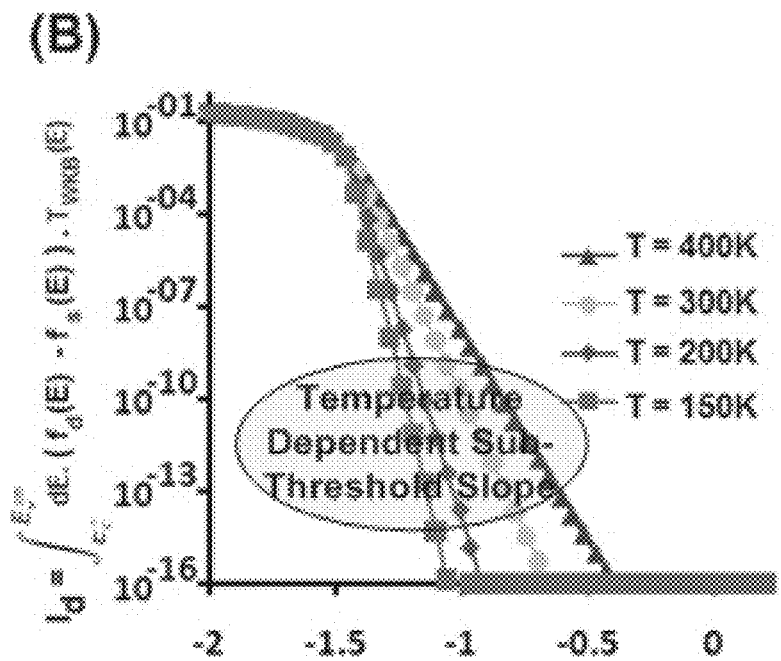
Figure 12C:
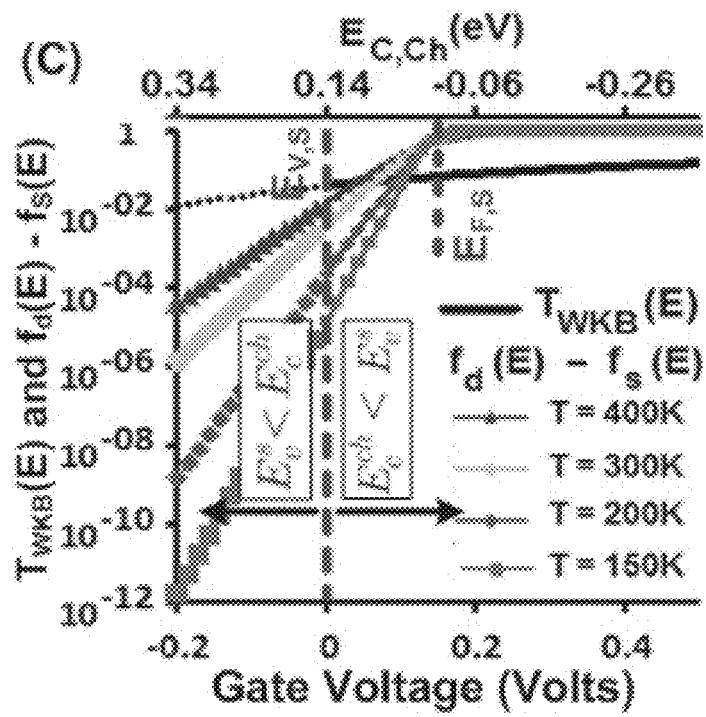
FIGS. 12C and 12D show an evaluation of the tunneling integral of FIG. 11 for the DDS NTFET in FIG. 6B.
Figure 12D:
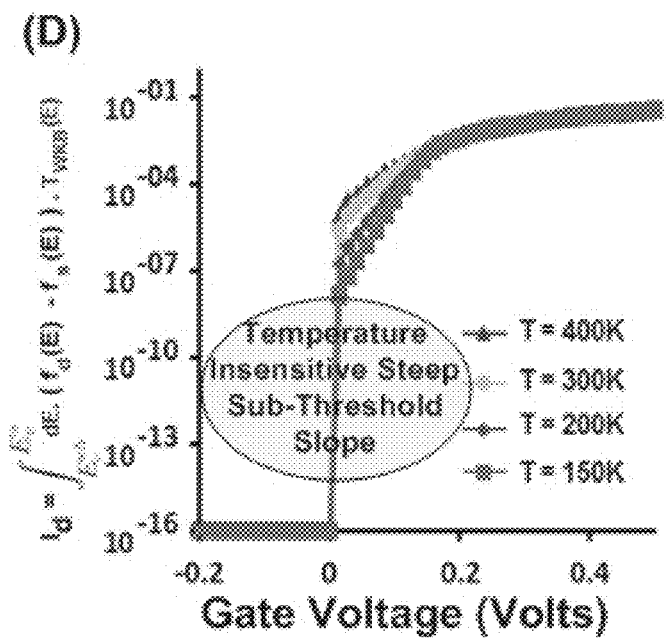

FIG. 12A shows that in a DDS PTFET, due to $E_{C,S}$ being 1.442 eV below the $E_{F,S}$ in the source region, a large portion of the temperature dependent part of the Fermi difference function |fd(E)fs(E)| occurs in the window between $E_{V,Ch}$ and $E_{C,S}$ when a negative gate voltage sweep is done, leading to a temperature dependent subthreshold slope, as shown in FIG. 12B. FIG. 12C shows that for a DDS NTFET, only a small part of the temperature dependent tail of the function |fd(E) fs(E)| occurs in the window between $E_{C,Ch}$ and $E_{V,S}$ when a positive gate voltage sweep is done, leading to a temperature independent subthreshold slope for the NTFET, as shown in FIG. 12D. Thus, the subthreshold characteristic of a TFET is highly dependent on the position of the Fermi level with respect to the band edge in the DDS region, because this relative position affects how much of the temperature dependent part |fd(E)fs(E)| is cutoff [2].

II. Loadless TFET-Based 4T SRAM Memory Device

As noted above, in some embodiments, the cell transistors can be arranged to provide latch circuitry consisting of cross-coupled transistors. In particular, the 4T memory devices can be arranged to provide a loadless 4T SRAM cell. Although loadless 4T SRAM cells are attainable via conventional CMOS processes, such devices hove two constraints that are difficult to achieve with conventional CMOS transistors.

First, a loadless 4T CMOS SRAM cell requires that the leakage current (IOFF) of the PMOS access transistor be larger than the leakage current of the NMOS drive transistor. This requirement is imposed since the loadless transistor lacks a pull up transistor to maintain the state at a multi-stable node storing a '1'. Unfortunately, the IOFF requirement generally results in the NMOS pull down transistors of a conventional CMOS loadless 4T SRAM cell to have a high threshold voltage (Vth) that the PMOS access transistor. As a result, this hampers the ON current of the SRAM cell during read access, and thus increases the read delay compared to conventional CMOS 6T SRAM cells.

Second, a loadless 4T SRAM can experience bit-flip during a write to an adjacent column. That is, if a bit-line connected to a multi-stable node of a loadless CMOS 4T cell storing a '1' is grounded, the conventional PMOS transistor will allow current leakage from the multi-stable node to the bit-line. If sufficient leakage occurs, this can result in the cell entering an unstable state, resulting in a loss of the information stored in the cell.

Accordingly, in some embodiments, the loadless 4T SRAM cell can be achieved via the use of TFET devices, particularly, PTFET access transistors and NTFET drive transistors. As described above and as illustrated in FIGs, a p-type TFET has a kT/q sub-threshold slope, compared to an n-type TFET which has a sub-kT/q slope. This difference in sub-threshold behavior helps to maintain the necessary IOFF ratio which is required for cell stability. For example, this results in an IOFF of approximately 1 nA/um for the PTFET device in FIG. 6A and an IOFF of approximately 14 fA/um for the NTFET device in FIG. 6B, while maintaining approximately the same Vth. Further, the asymmetric source drain architecture of the TFETs is exploited to solve the adjacent bit-flip problem of unselected Loadless 4T SRAM cells during a column write operation.

Figure 13:
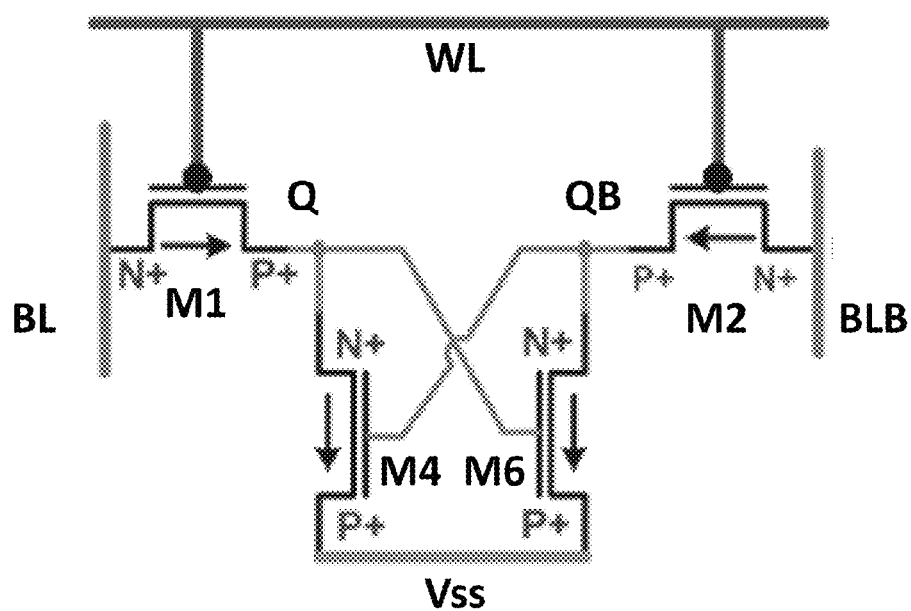
FIG. 13 shows the schematic of a Loadless 4T TFET SRAM cell 1300 in accordance with the various embodiments.

FIG. 13 shows the schematic of a Loadless 4T TFET SRAM cell 1300 in accordance with the various embodiments. The bit-cell 1300 includes of a pair of cross-coupled pull down NTFET transistors, M4 and M6 and a pair of access PTFET transistors M1, M2. The first pull-down transistor M4 couples a first storage or multi-stable node Q and a low reference voltage or ground node VSS. The second pull-down transistor M6 couples a second storage or multi-stable node QB and the ground node VSS. As noted above, transistors M4 and M6 are cross-coupled. That is, the drain node of NTFET M4 (i.e., the first multi-stable node Q) is coupled to the gate node of the NTFET M6. Similarly, the drain node of NTFET M6 (i.e., the second multi-stable node QB) is coupled to the gate node of the NTFET M4. As a result, the arrangement of transistors M4 and M6 result in nodes Q and QB to be complementary. As shown in FIG. 13, the first access transistor M1 couples the first storage node Q to a first bit line BL and the second access transistor M2 couples the first storage node Q to a second bit line BLB. The first and second access transistors M1, M2 can be controlled by a control signal on at write line node WL.

Figure 14:
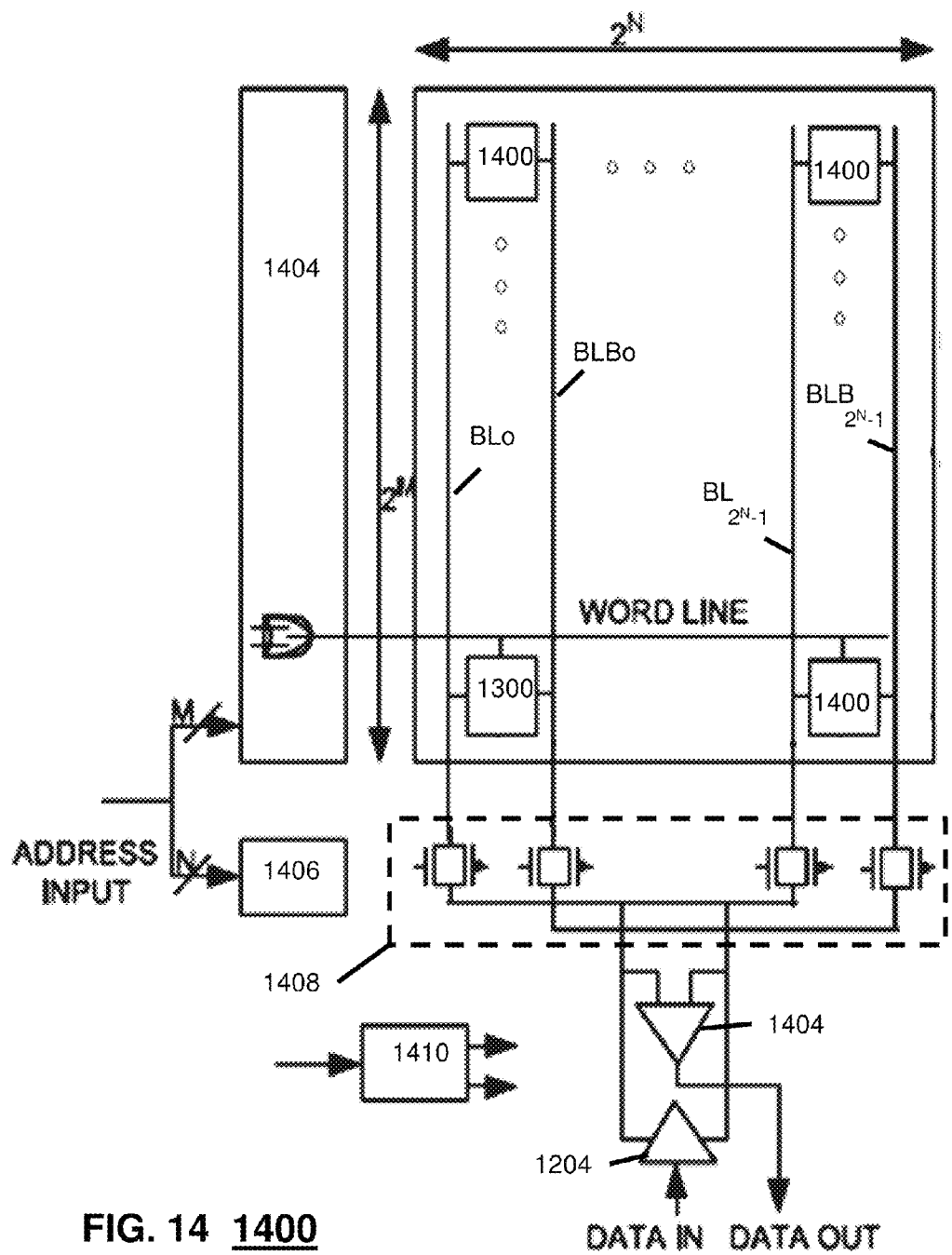
FIG. 14 is a block diagram of a memory portion 1400 in an integrated circuit in accordance with the various embodiments.

The bit-cell 1300 can be included in a memory array, For example, FIG. 14 is a block diagram of a memory portion 1400 in an integrated circuit in accordance with the various embodiments of the invention. The memory portion 1400 consists of a $2^M \times 2^N$ array 1402 of bit-cells 1300, where the VDD and VSS nodes of each of the bit-cells 1300 is coupled to a supply voltage and a reference voltage, respectively (not shown). As in a conventional memory array, memory 1400 includes a row decoder 1404 for generating signals for word lines WLm (m=0 . . . $2^M$–1) and a column decoder 1406 for generating signals for reading and writing to bit lines BLn and BLBn (n=0 . . . $2^N$–1) via column multiplexer 1408. The decoders 1404 and 1406 are configured to receive an address from a controller 1410 to select the bit-cells to be accessed. The controller 1408 can receive signals from elsewhere in the IC. The controller 1410 can also be configured to selectively operate a write driver 1412 and a sense amplifier 1414 to write and read signals to the bit lines in the array.

As noted above, the first and second access transistors M1, M2 are configured to be unidirectional. In particular, the first access transistor M1 is configured to allow current to flow from bit line BL to first multi-stable node Q when transistor M1 is on and to prevent little or no current to flow from multi-stable node Q to bit line BL when access transistor M1 is on or off. Similarly, the second access transistor M2 is configured to allow current to flow from bit line BLB to second multi-stable node QB when transistor M2 is on and to prevent little or no current to flow from multi-stable node QB to bit line BLB when access transistor M2 is on or off. Thus, the transistors M1 and M2 are in an inward access configuration. However, the various embodiments of the invention are not limited to solely the use of TFETs for access transistors M1 and M2. Rather, any type of unidirectional transistor configuration. For example, in some embodiments, unidirectional quantum field effect transistors or the like can be used.

To read a stored value from the bit-cell topology of FIG. 13, both bit-lines would pre-charged to VDD and access the access transistors would be enabled. If nodes Q and QB are storing a '1' and a '0', respectively, this means that M4 is off and M6 is on. Therefore, the bit-line BLB would be discharged through the current flow path formed by M2 and M6 while the bit-line BL would remain at '1'. Similarly, if nodes Q and QB are storing a '0' and a '1', respectively, this means that M4 is on and M6 is off. Therefore, the bit-line BL would be discharged through the current flow path formed by M1 and M4 while the bit-line BLB would remain at '1'. Thereafter, the difference of these bit-lines is sensed by the sense amplifier to determine the stored value.

To write a '1' to this bit cell topology, bit-line BL would be pre-charged VDD and bit-line BLB would be discharged to ground. Thereafter, the access transistors would be enabled and the charge on BL would set node Q to a '1'. However, access transistor M2 cannot pull down the node QB since it conducts only in inward direction. Therefore, pull down transistor M6 must pull down the node Q without any assistance from access transistor M2. Similarly, to write a '1' to this bit cell topology, bit-line BLB would be pre-charged to VDD and bit-line BL would be discharged to ground. Thereafter, the access transistors would be enabled and the charge on bit-line BLB would set node QB to a '1'. However, access transistor M1 cannot pull down the node Q since it conducts only in inward direction. Therefore, pull down transistor M4 must pull down the node Q without any assistance from access transistor M1.

Figure 15:
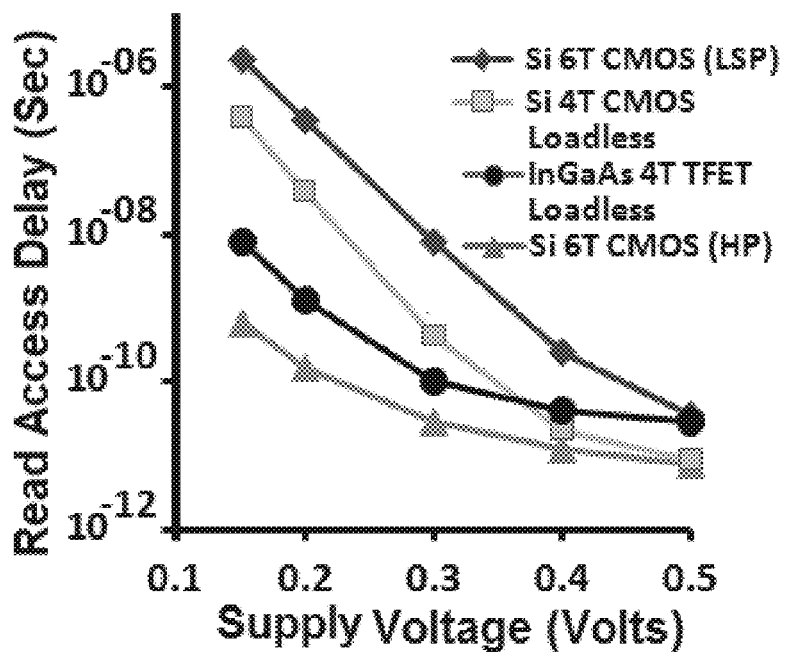
FIG. 15 shows an x-y plot of read access delay as a function of supply voltage for a loadless 4T TFET SRAM cell compared to conventional SRAM cells, including a high performance (HP) 6T CMOS SRAM cell, a low standby power (LSP) 6T CMOS SRAM cell, and a loadless 4T CMOS cell.
Figure 16:
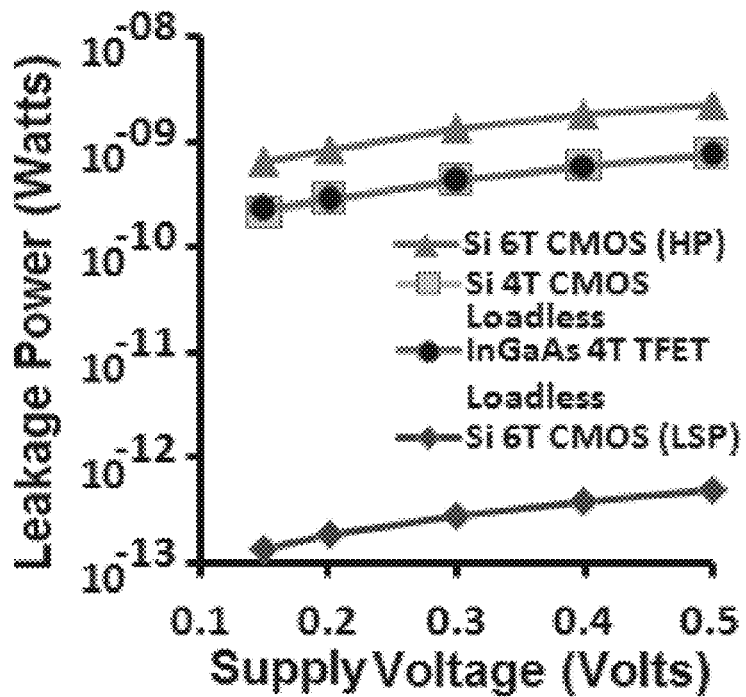
FIG. 16 shows an x-y plot of leakage power as a function of supply voltage for a loadless 4T TFET SRAM cell compared to conventional SRAM cells, including a high performance (HP) 6T CMOS SRAM cell, a low standby power (LSP) 6T CMOS SRAM cell, and a loadless 4T CMOS cell.

In the various embodiments, since the drive or pull down NTFET transistors provide a steep subthreshold, these NTFET transistors are capable of delivering a high ION current while simultaneously satisfying the IOFF requirement described above. As a result, a loadless 4TFET cell in accordance with the various embodiments can be significantly faster that a loadless 4T CMOS cell for at least low voltage applications (<0.3V). This is illustrated in FIG. 15, FIG. 15 shows an x-y plot of read access delay as a function of supply voltage for a loadless 4T TFET SRAM cell compared to conventional SRAM cells, including a high performance (HP) 6T CMOS SRAM cell, a low standby power (LSP) 6T CMOS SRAM cell, and a loadless 4T CMOS cell. FIG. 15 shows that even though the loadless 4T TFET SRAM cell has higher read access delay than a conventional HP 6T CMOS SRAM cell, at low voltages the loadless 4T TFET SRAM cell provided significantly lower read access delays at low voltages (<0.3V) than a conventional LSP 4T CMOS SRAM cell. Further, as shown in FIG. 15, the lower read access delay of the loadless 4T TFET SRAM cell is provided without significantly increasing current leakage as compared to a conventional HP 4T CMOS SRAM cell. FIG. 16 shows an x-y plot of leakage power as a function of supply voltage for a loadless 4T TFET SRAM cell compared to conventional SRAM cells, including a high performance (HP) 6T CMOS SRAM cell, a low standby power (LSP) 6T CMOS SRAM cell, and a loadless 4T CMOS cell. As shown in FIG. 16, the leakage power of the loadless 4T TFET SRAM cell and a conventional LSP 4T CMOS SRAM cell are approximately the same. Accordingly, the loadless 4T TFET SRAM cell can be used in place of a conventional LSP 4T CMOS SRAM cell without increasing power requirements at low voltages 0.3V). Additionally, as the leakage power of the loadless 4T TFET SRAM cell and a conventional HP 6T CMOS SRAM cell are not significantly different, the loadless 4T TFET SRAM cell can be used in place of a conventional 6T CMOS SRAM cell, resulting in a small device at the cost of only a modest increase in power requirements and read access delay.

Figure 17:
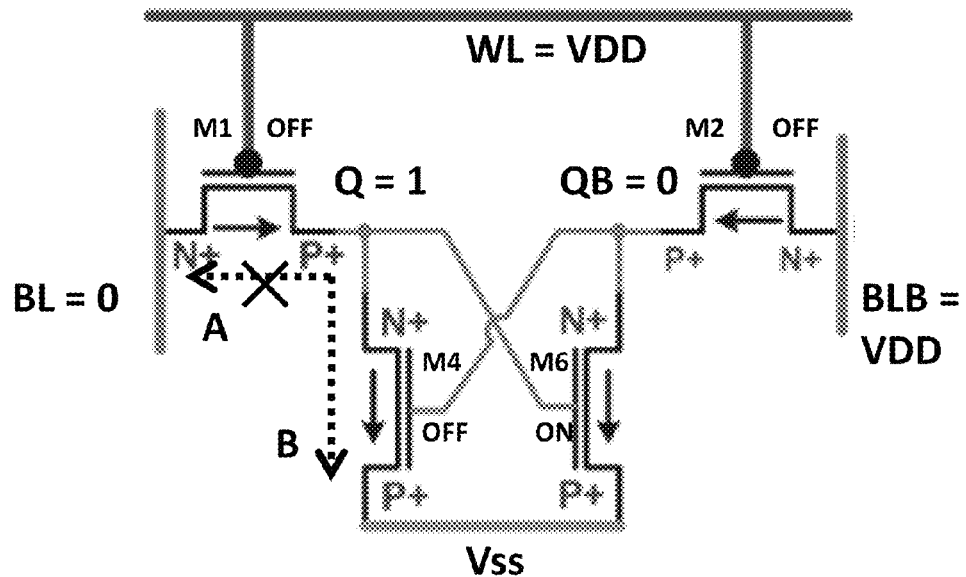
FIG. 17 is a schematic of the loadless 4T NTFET SRAM cell of FIG. 13 during a write associated with an adjacent column.
Figure 18:
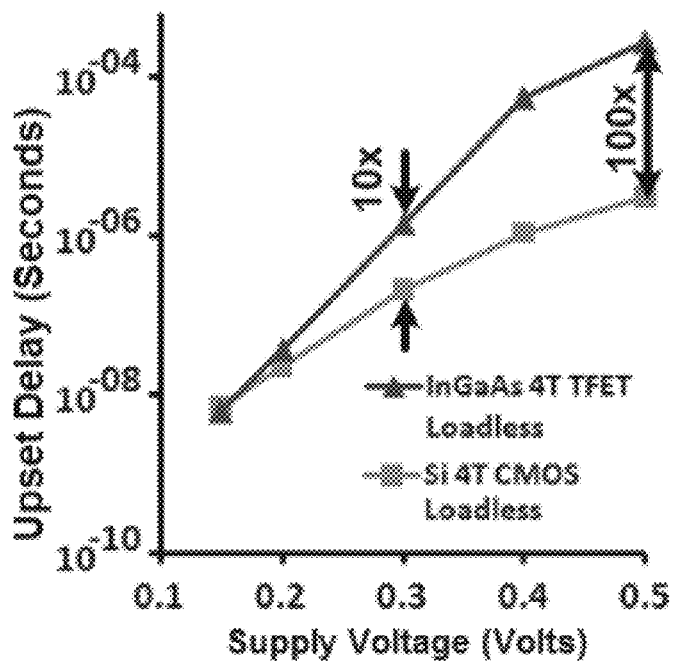
FIG. 18 is a plot of upset delay as a function of supply voltage for a loadless 4T NTFET SRAM and a conventional 4T CMOS SRAM Cell.

The additional advantage of the loadless 4T TFET SRAM cell described above is the reduction of bit-flip during column write due to the asymmetric nature of the PTFET access transistors. This is illustrated with respect to FIG. 17, FIG. 17 is a schematic of the loadless 4T NTFET SRAM cell of FIG. 13 during a write associated with an adjacent column. Consider the case where node Q stores a '1' (M4 is OFF and M6 is ON) and bit-line Q is shared with cells in an adjacent column. During a write to this adjacent column, writeline WL would be set to VDD to disable the access transistors M1 and M2. However, if a '0' is being written to the adjacent column, bit-line BL would be discharged to ground. If transistors M1 and M4 were conventional CMOS transistors, leakage paths A and B, respectively, would result. Accordingly, since no pull transistor is provided for node Q, the voltage a node Q could be reduced by the current leakage through paths A and B to the point that the SRAM cell become unstable and lead to bit upset. However, by utilizing a PTFET transistor for M1 and exploiting its unidirectional nature, the leakage path A through transistor M1 is effectively eliminated. Accordingly, as the only one leakage path remains, path B, it would take a longer amount of time for the voltage at node Q to be significantly changed. Accordingly, the upset delay for a loadless 4T TFET SRAM cell will be significant larger that that of a conventional 4T CMOS SRAM cell. This is illustrated, in FIG. 18. FIG. 18 is a plot of upset delay as a function of supply voltage for a loadless 4T NTFET SRAM and a conventional 4T CMOS SRAM Cell. FIG. 18 shows that the upset delay or retention time of a Loadless 4T TFET cell can be up to 100 times that of the Loadless 4T CMOS.

II. TFET-Based 4T NDR Memory Device

Figure 19:
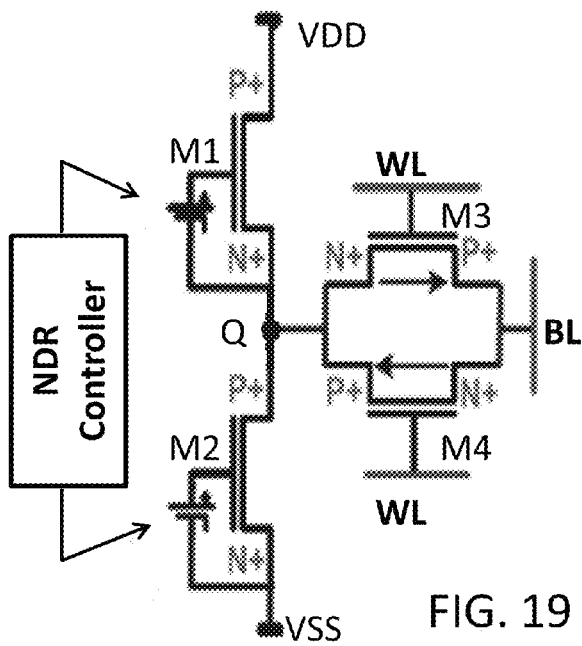
FIG. 19 is a schematic of a TFET based 4T NDR memory cell 1900 in accordance with the various embodiments.

As noted above, in some embodiments, the cell transistors can be arranged to provide latch circuitry to provide an NDR memory device, as shown below in FIG. 19. FIG. 19 is a schematic of a TFET based 4T NDR memory cell 1900 in accordance with the various embodiments. As shown in FIG. 19, the cell 1900, includes first and second TFET transistors, M1 and M2, arranged in series between a supply voltage VDD and a ground voltage VSS and with a storage or multi-stable node Q in between for storing a '1' or a '0'. Node Q is coupled to a bit-line BL via TFET access transistors M3 and M4. Two TFET transistors are needed to allow read and write to node Q.

Figure 20:
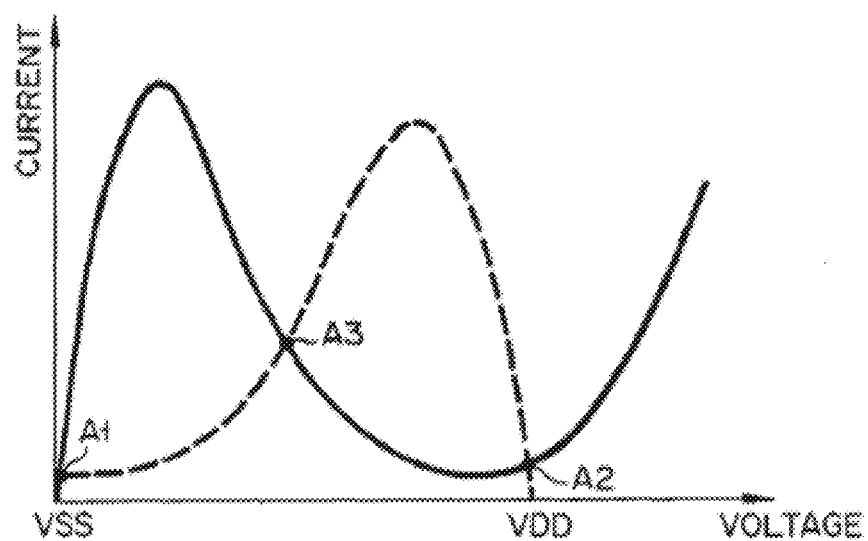
FIG. 20 is an x-y plot of the voltage versus currents for diodes in an exemplary NDR memory device.

As noted above, the distinguishing feature of an NDR diode is that current first increases with increasing applied voltage, reaching a peak value. Then, the current decreases with increasing applied voltage over a range of applied voltages until reaching a minimum value. Finally, as voltage is further increased, the current increases again. Thus, the current-voltage relationship is shaped like the letter "N". When two such devices are placed in series, M1 and M2 operate as pull up and pull down devices, respectively, for node Q. Thus, the currents flowing through M1 and M2 will vary depending on the voltage at Q as shown in FIG. 20. Specifically, the current flowing through M1 changes as indicated by a solid-line curve and the current flowing through M2 changes as represented by a broken-line curve. As will be clearly understood from FIG. 20, the currents for M1 and M2 are different except at the points A1, A2 and A3 (hereinafter referred to as "current stable points") where currents through M1 and M2 are the same.

In the configuration illustrated in FIG. 19, M1 and M2 are NTFETS. However, the various embodiments are not limited in this regard and other configuration that provide an NDR memory device TFETs or the like can be used in the various embodiments.

To write to the cell 1900, bit-line BL is charged to a voltage corresponding to a '0' or a '1', which corresponds to one of points A1 and A3, respectively, and at least access transistor M4 is enabled by writeline WL. Thereafter, once Q is set to a desired voltage, the access transistor M4 is disabled. Afterwards, if the voltage at Q is not exactly at the voltage for one of A1 or A3, the pull up/pull down action of transistors M1 and M2 will drive the voltage at Q to the closest stable point.

To read the cell 1900, bit-line BL can be charged to VDD. Thereafter, at least access transistor M3 is enabled by writeline WL. Thereafter, depending on the values at Q, the bit-line is unchanged (if Q is at '1') or is discharged (if Q is at '0'). After a read time, the access transistor M3 is disabled. Afterwards, the stored value can be determined based on the state of bit-line BL.

Figure 21:
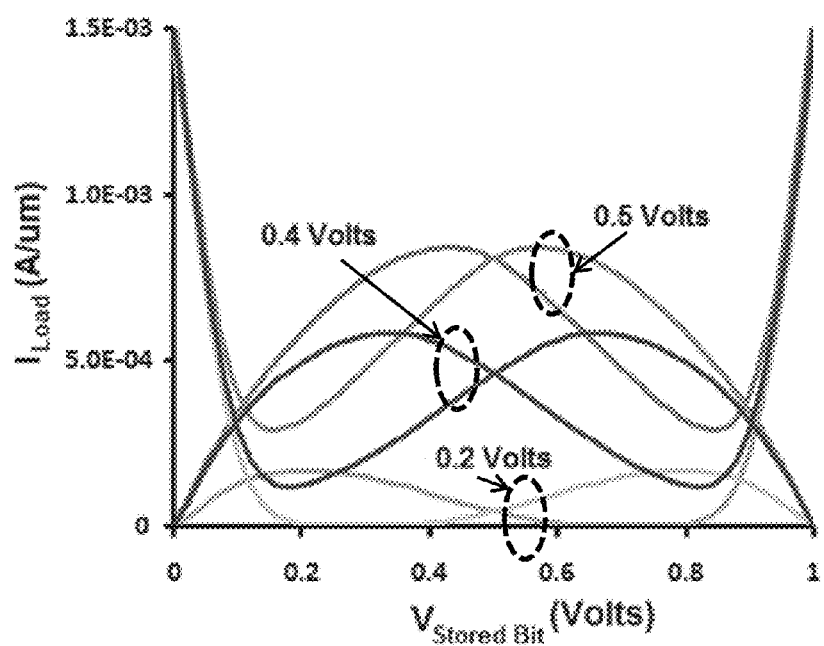
FIG. 21 is x-y plot of the voltage at Q verses the currents in M1 and M2 for different bias voltages.

An additional feature of cell 1900 is the ability to control the NDR characteristics of each of transistors M1 and M2. In such embodiments, an NDR controller is provided that specifies a bias voltage between the gate node and the N+ node of each of transistors M1 and M2. As this voltage is adjusted, the NDR characteristics will vary, as shown in FIG. 21. FIG. 21 is an x-y plot of the voltage at Q versus the currents in M1 and M2 for different bias voltages. As illustrated in FIG. 21, this configuration allows the NDR characteristics of transistors M1 and M2 can be tuned independently. As a result, the transistors M1 and M2 can be configured to provide specific stable points or specific currents at the stable points.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A four transistor (4T) memory device, comprising:
 a first cell transistor and a second cell transistor, the first and second cell transistors coupled to each other and defining latch circuitry having at least one multi-stable node; and
 a first access transistor and a second access transistor, the first and second access transistors coupling the at least one multi-stable node to at least one bit-line;
 wherein each of the first and second cell transistors and each of the first and second access transistors comprises a unidirectional field effect transistor configured for conducting current in a first direction and to be substantially incapable of conducting current in a second direction, wherein the first and second access transistors are configured to be p-type transistor devices, and wherein the first and second cell transistors are configured to be n-type transistor devices.

2. The device of claim 1 wherein the field effect transistor comprises a quantum field effect transistor.

3. The device of claim 1 wherein field effect transistor comprises a tunnel field effect transistor.

4. The device of claim 1, wherein the at least one multi-stable node comprises a first multi-stable node and a second multi-stable node, and wherein the first and second cell transistors are cross-coupled pull down transistors, wherein the first cell transistor is oriented to conduct current from the first multi-stable node to a ground node, and wherein the second cell transistor is oriented to conduct current from the second multi-stable node to the ground node.

5. The device of claim 4, wherein at least one bit-line comprises a first bit-line and a second bit-line, wherein the first access transistor is configured to conduct current from the first bit-line to the first multi-stable node and to be substantially incapable of conducting current from the first multi-stable node to the first bit-line, and wherein the second access transistor is configured to conduct current from the second bit-line to the second multi-stable node and to be substantially incapable of conducting current from the second multi-stable node to the second bit-line.

6. The device of claim 4, wherein the first and second access transistors are configured to be stronger than the first and second cell transistors.

7. A four transistor (4T) memory device, comprising:
a first pull down transistor and a second pull down transistor in a cross coupled configuration, the first pull down transistor coupling a first multi-stable node and a ground node, and the second pull down transistor coupling a second multi-stable node and the ground node; and
a first access transistor and a second access transistor, the first access transistor coupling a first bit-line to the first multi-stable node, and the second access transistor coupling a second bit-line to the second multi-stable node, wherein the first access transistor is configured to conduct current from the first bit-line to the first multi-stable node and to be substantially incapable of conducting current from the first multi-stable node to the first bit-line, and wherein the second access transistor is configured to conduct current from the second bit-line to the second multi-stable node and to be substantially incapable of conducting current from the second multi-stable node to the second bit-line, wherein the first and second access transistors are configured to be p-type transistor devices, and wherein the first and second pull-down transistors are configured to be n-type transistor devices.

8. The device of claim 7 wherein at least one of the first and second access transistors comprises a quantum field effect transistor.

9. The device of claim 7, wherein at least one of the first and second access transistors comprises a tunnel field effect transistor.

10. The device of claim 7, wherein the first pull down transistor is configured to conduct current from the first multi-stable node to a ground node and to be substantially incapable of conducting current from the ground node to the first multistable node, and wherein the second pull down transistor is configured to conduct current from the second multi-stable node to the ground node and to be substantially incapable of conducting current from the ground node to the second multistable node.

11. The device of claim 7, wherein the first and second access transistors are configured to be stronger than the first and second pull down transistors.

12. The device of claim 1, wherein the p-type transistor devices are configured to have a subthreshold slope $n \times kT/q$ and the n-type transistor devices are configured to have a subthreshold slope $m \times kT/q$, where $n \geq 1$, $m < 1$, k is the Boltzmann constant, q is the electronic change constant, and T is the temperature of operation.

13. The device of claim 7, wherein the p-type transistor devices are configured to have a subthreshold slope $n \times kT/q$ and the n-type transistor devices are configured to have a subthreshold slope $m \times kT/q$, where $n \geq 1$, $m < 1$, k is the Boltzmann constant, q is the electronic change constant, and T is the temperature of operation.

* * * * *